May 5, 1964 R. E. ALLEN 3,131,460

METHOD OF BONDING A CRYSTAL TO A DELAY LINE

Filed Nov. 9, 1959

INVENTOR.
RICHARD E. ALLEN
BY Clarence R. Patty, Jr.
ATTORNEY

United States Patent Office 3,131,460

Patented May 5, 1964

3,131,460

METHOD OF BONDING A CRYSTAL TO A DELAY LINE

Richard E. Allen, Corning, N.Y., assignor to Corning Glass Works, Corning, N.Y., a corporation of New York Filed Nov. 9, 1959, Ser. No. 851,762
10 Claims. (Cl. 29—155.5)

This invention relates to the technique of bonding of one body to another and more particularly to a method of bonding either ceramic or quartz piezoelectric crystals to a solid delay line of fused silica or other suitable glass or ceramic material.

Solid delay lines require at least one, and usually more, piezoelectric crystals secured thereto to convert energy of one form to energy of another. As will be hereinafter used, the term "crystal" denotes either a quartz or piezoelectric ceramic blank before it has been bonded to another body. Such a blank is capable of oscillating, at a given frequency determined by its cut and thickness, under an applied alternating voltage. The term "transducer" denotes the bonded assembly of crystal to delay line facet. In this particular context, the delay line input transducer converts pulses of electrical energy into pulses of mechanical energy at the input to the delay line. The pulses of mechanical energy then travel the length or prescribed path in the delay line and appear at the output facet where the output transducer converts the pulses of mechanical energy back to electrical energy with a delay time (as compared with the input pulse) introduced therein in accordance with the transit time from the input transducer to the output transducer.

As presently constituted, delay lines utilize crystals that resonate in the frequency range of 10–40 megacycles and have thicknesses ranging from about .008–.002 inch. When dealing with crystals of these thicknesses, it becomes important that handling be maintained at a minimum and that they be handled with extreme care; otherwise, a high incidence of breakage occurs. Additionally, the bond which mates the crystal to the silica delay line becomes extremely important. If the bond is either incomplete or for any reason is uneven, the resultant transducer signal will seriously suffer from the standpoint of both bandwidth and fidelity.

The present state of the crystal-to-delay line bonding art is exemplified by Patent No. 2,709,147, issued to A. W. Ziegler on May 24, 1955. This patent teaches a method of bonding, utilizing burnished indium coatings on the mating surfaces of both the delay line and crystal. To practice the method of that patent one is faced with some serious drawbacks which become apparent to those skilled in the art who are aware of the fact that bonding indium-to-indium presents a serious problem. Because of the formation of oxidation products on indium, both surfaces must be burnished immediately after removal from the vacuum chamber and before the bonding step, if they are to be properly mated. Ziegler is aware of this drawback and suggests that the indium coated elements be maintained in the evacuated coating chamber until ready for the further steps of burnishing before bonding. Then, one has a very limited time during which both surfaces are to be burnished and all the parts accurately aligned for bonding under vacuum. This completely obviates the possibility of any advanced production and the storage of indium coated parts.

Another problem which is not readily apparent to those trying to practice the Ziegler teachings, manifests itself during the crystal coating process. The extreme difficulty of evaporating a satisfactory coating of indium onto the crystal surfaces is attributable to the fact that a crystal has a very low heat capacity because it is so thin. That is, the crystal has no heat sink to dissipate any heat. As a result, the hot evaporated indium deposited on the crystal raises the crystal temperature to a point where the indium deposited thereon begins to melt. The melted indium then begins to form balls on the surface of the crystal due to the surface tension, thereby producing an unsatisfactory coating. This represents a source of a great number of crystal rejections.

Still another drawback attributable to the Ziegler method is the fact that both mating surfaces must be burnished. While it is relatively simple to burnish a facet of a solid delay line due to the mass of the delay line, it will become readily apparent that to burnish crystals ranging in thickness from .008–.002 inch, extreme caution must be exercised otherwise the crystals will fracture.

An important consideration in determining the most appropriate method of bonding crystals to delay lines, is to consider one wherein the crystal itself is not subjected to excessive heat to raise its temperature to the melting point of the deposited coating. The method must be one that will assure that the mating will be done in such a manner as to provide both a complete bond and a bond that is reproducible from one delay line to another.

All of the above conditions are satisfied in the instant application by the use of a metallic coating on either quartz or ceramic crystals that has a great mutual attraction to a coating on a delay line wherein the coatings are particularly suitable for a cold diffusion method of bonding. I have found that these mutually attractive coatings are gold and indium.

In accordance with the foregoing, it becomes an object of the instant invention to provide a cold diffusion method of bonding crystals to delay lines.

One other object of the instant invention is to provide a cold diffusion method of bonding crystals to delay lines wherein the crystal is not subjected to a temperature above the melting point of the deposited coating.

Another object of the instant invention is to provide a cold diffusion method of bonding crystals to delay lines wherein there is a minimum of crystal handling in preparation for the bonding step.

Yet another object of the instant invention is to provide a cold diffusion method of bonding crystals to delay lines utilizing coatings that may be stored without deterioration.

Still another object of the instant invention is to provide a cold diffusion method of bonding crystals to delay lines that provides a complete bond.

A further object of the instant invention is to provide a cold diffusion method of bonding crystals to delay lines that is reproducible from one delay line to another.

A still further object of the instant invention is to provide a cold diffusion method of bonding crystals to delay lines that is relatively inexpensive yet lends itself to a mass production type of assembly.

Other and more detailed objects of this invention, as well as further advantages thereof, will become apparent to those skilled in the art from a consideration of the following description and claims taken in connection with the accompanying drawing wherein:

Figure 1:
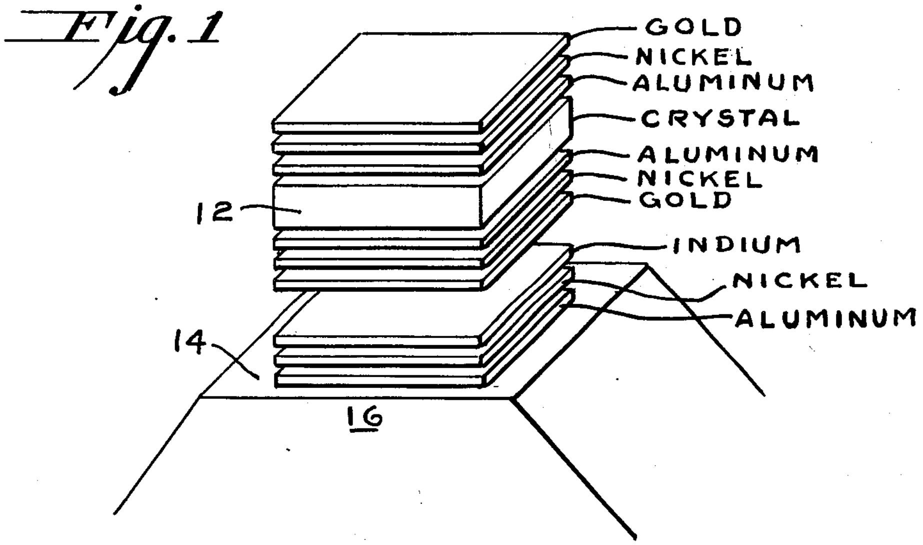
FIG. 1 is an exploded view, in side elevation, diagrammatically depicting a piezoelectric crystal, which may be either of quartz or of a ceramic material such as barium titanate, and its respective coatings according to one embodiment of the invention arranged to be mated with a coated facet of a solid delay line.

Referring now to FIG. 1, crystal 12, which may be either ceramic or quartz, is shown with successive coatings of aluminum, nickel and gold deposited thereon. While I shall hereinafter refer to nickel generically as one of the coats, it will be obvious that nickel alloys such as, for example, a nickel-chromium alloy may be substituted therefor. These coatings may be put on in any one of many well-known ways as will be obvious to those skilled in the art. However, and by way of example, it has been found that a vacuum deposition method readily lends itself to depositing the crystal coatings with a minimum amount of handling. With this method, the crystal is placed in a chamber and successive coatings of aluminum, nickel and gold are deposited thereon without the need for removing the crystal or the vacuum after each coating operation.

In accordance with these teachings it is suggested that a layer having a thickness of about 4000 Angstrom units of aluminum be deposited first on the crystal surface. Then, a layer of about 1000 Angstrom units of nickel or a nickel-chromium alloy such as 80% Ni—20% Cr may be deposited over the aluminum layer and finally, a layer of about 2000 Angstrom units of gold may be deposited over the nickel layer. It should be here noted that the thicknesses of the above-mentioned layers are only approximate and are not critical to the success of the operation.

Next, a layer of aluminum, having a thickness of about 1000 Angstrom units may be deposited first on facet 14 of delay line 16. Thereover, a layer of nickel may be deposited also having a thickness of about 1000 Angstrom units. Finally, a heavy layer of indium, which may range in thickness from about 25,000–150,000 Angstrom units may be deposited over the nickel layer.

The delay line and the crystal surfaces are now ready for mating. The mating operation consists of placing the gold surface of crystal 12 in intimate contact with the indium surface on the facet 14 of delay line 16. At this point, it should be mentioned that if the indium coated surface has been exposed to the air for any appreciable length of time the surface should be burnished with clean nylon parachute cloth. This operation merely consists of lightly rubbing the indium surface with nylon parachute cloth wrapped around a finger.

After the burnishing operation, if such is necessary, the gold-indium surfaces are pressed together at a pressure of approximately 250 pounds per square inch in a vacuum of at least one millimeter of mercury. The delay line-crystal assembly is maintained in this condition at a temperature ranging from about 125° C. to 150° C. for approximately 16 hours, after which the pressure may be removed.

Figure 2:
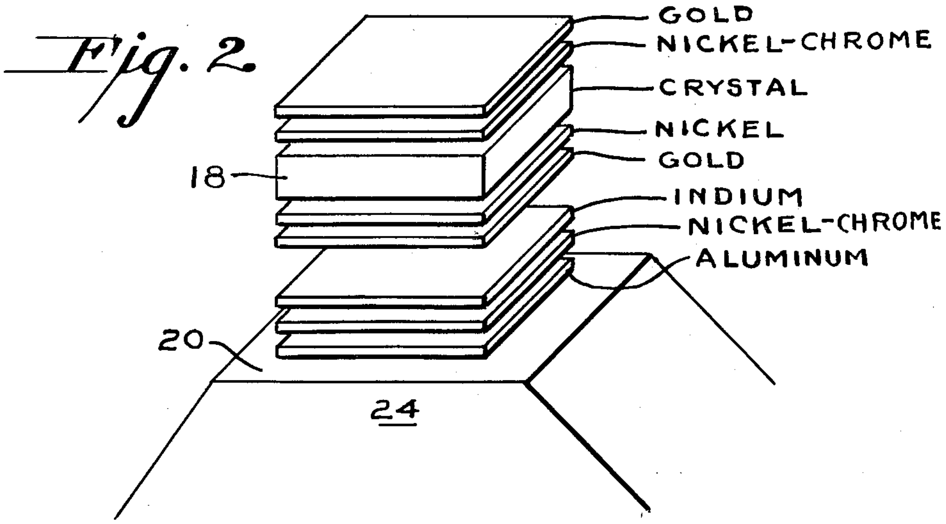
FIG. 2 is an exploded view, in side elevation, diagrammatically depicting a quartz crystal and its respective coatings according to another embodiment of the invention arranged to be mated with a coated facet of a solid delay line.

Referring now to FIG. 2 there is depicted a combination of coatings that has particular applicability to quartz crystals although satisfactory results may be also expected with ceramic crystals. In this embodiment, a nickel-chromium alloy layer of about 1000 Angstrom units is deposited directly onto the crystal surfaces. Thereafter, a gold layer of about 2000 Angstrom units is deposited over the nickel-chromium layer. The aluminum, nickel and indium layers applied to facet 20 of delay line 24 are identical with the similar layers of FIG. 1.

The bonding method with regard to FIG. 2 is also identical with the bonding method described with regard to FIG. 1.

As still another embodiment, I have found that it is also possible to apply a gold-coated surface to a crystal utilizing a vacum deposition method which I shall refer to as sequential deposition. This consists of placing the crystal to be coated in an evacuated chamber and first depositing a chromium layer thereon. During the latter part of the chromium deposition, a gold deposition process is simultaneously started so that for an interval, depending on the desired combination, both gold and chromium are being deposited. Thereafter, the chromium deposition is stopped and the gold continues until the desired thickness of gold is deposited over the chromium-gold and chromium layers.

While my invention has been explained, so far, in terms of providing gradient subcoatings for the gold as well as indium surfaces, those skilled in the metallurgical arts will readily recognize that whether the gold is applied directly to the crystal surface or to the afore-mentioned undercoats, is determined by the surface composition and whether or not the gold is capable of adhering well without a subcoat. So too, can the indium be applied directly to one of the facets of the delay line without the need for the gradient subcoatings.

Here too, while I have described the embodiments in terms of thicknesses of layers, it should be understood that these thicknesses are only approximate and are not critical to the success of the operation, nor do I wish to be restricted insofar as the surfaces on which the coatings are applied. Those skilled in the art will appreciate that the crystal coatings herein described may instead be applied to the facet if the facet coatings are applied to the crystal.

While I have described what is presently considered the preferred embodiments of my invention, it will be obvious to those skilled in the art that various other changes and modifications may be made therein without departing from the inventive concept contained herein, and it is therefore aimed in the appended claims, to cover all such changes and modifications that fall within the true spirit and scope of my invention.

What is claimed is:

1. A cold diffusion method of bonding a piezoelectric crystal formed of material selected from the group consisting of ceramic and quartz, to a solid delay line formed of material selected from the group consisting of fused silica, glass and ceramic, comprising the steps of depositing in the order named a first plurality of successive metallic layers comprising aluminum, nickel and gold on the broad surfaces of said crystal, depositing in the order named a second plurality of successive metallic layers comprising aluminum, nickel and indium on a facet of said delay line, disposing said gold layer adjacent said indium layer, and thereafter heating the assembly so formed to a temperature ranging from about 125° C. to about 150° C. while applying a pressure of approximately 250 pounds per square inch to said assembly to bond said crystal to said delay line.

2. A cold diffusion method of bonding a piezoelectric crystal formed of material selected from the group consisting of ceramic and quartz, to a solid delay line formed of material selected from the group consisting of fused silica, glass and ceramic, comprising the steps of depositing in the order named a first plurality of successive metallic layers comprising aluminum, nickel and indium on the broad surfaces of said crystal, depositing in the order named a second plurality of successive metallic layers comprising aluminum, nickel and gold on a facet of said delay line, disposing said indium layer adjacent said gold layer, and thereafter heating the assembly so formed to a temperature ranging from about 125° C. to about 150° C. while applying a pressure of approximately 250 pounds per square inch to said assembly to bond said crystal to said delay line.

3. A cold diffusion method of bonding a piezoelectric crystal formed of material selected from the group consisting of ceramic and quartz, to a solid delay line formed of material selected from the group consisting of fused silica, glass and ceramic, comprising the steps of depositing in the order named a first plurality of successive metallic layers comprising nickel-chrome and gold on the broad surfaces of said crystal, depositing in the order named a second plurality of successive metallic layers comprising aluminum, nickel-chrome and indium on a facet of said delay line, disposing said gold layer adjacent said indium layer, and thereafter heating the assembly so formed to a temperature ranging from about 125°

C. to about 150° C. while applying a pressure of approximately 250 pounds per square inch to said assembly to bond said crystal to said delay line.

4. A cold diffusion method of bonding a piezoelectric crystal formed of material selected from the group consisting of ceramic and quartz, to a solid delay line formed of material selected from the group consisting of fused silica, glass and ceramic, comprising the steps of depositing in the order named a first plurality of successive metallic layers comprising nickel and gold on the broad surfaces of said crystal, depositing in the order named a second plurality of successive metallic layers comprising aluminum, nickel-chrome and indium on a facet of said delay line, disposing said gold layer adjacent said indium layer, and thereafter heating the assembly so formed to a temperature ranging from about 125° C. to about 150° C. while applying a pressure of approximately 250 pounds per square inch to said assembly to bond said crystal to said delay line.

5. A cold diffusion method of bonding a piezoelectric crystal formed of material selected from the group consisting of ceramic and quartz, to a solid delay line formed of material selected from the group consisting of fused silica, glass and ceramic, comprising the steps of depositing in the order named a first plurality of successive metallic layers comprising aluminum, nickel-chrome and indium on the broad surfaces of said crystal, depositing in the order named a second plurality of successive metallic layers comprising nickel-chrome and gold on a facet of said delay line, disposing said indium layer adjacent said gold layer, and thereafter heating the assembly so formed to a temperature ranging from about 125° C. to about 150° C. while applying a pressure of approximately 250 pounds per square inch to said assembly to bond said crystal to said delay line.

6. A cold diffusion method of bonding a piezoelectric crystal formed of material selected from the group consisting of ceramic and quartz, to a solid delay line formed of material selected from the group consisting of fused silica, glass and ceramic, comprising the steps of depositing in the order named a first plurality of successive metallic layers comprising aluminum, nickel-chrome and indium on the broad surfaces of said crystal, depositing in the order named a second plurality of successive metallic layers comprising nickel and gold on a facet of said delay line, disposing said indium layer adjacent said gold layer, and thereafter heating the assembly so formed to a temperature ranging from about 125° C. to about 150° C. while applying a pressure of approximately 250 pounds per square inch to said assembly to bond said crystal to said delay line.

7. A cold diffusion method of bonding a piezoelectric crystal formed of material selected from the group consisting of ceramic and quartz, to a solid delay line formed of material selected from the group consisting of fused silica, glass and ceramic, comprising the steps of depositing a layer of gold on the broad surfaces of said crystal, depositing a layer of indium on a facet of said delay line, disposing said gold layer adjacent said indium layer, and thereafter heating the assembly so formed to a temperature ranging from about 125° C. to about 150° C. while applying a pressure of approximately 250 pounds per square inch to said assembly to bond said crystal to said delay line.

8. A cold diffusion method of bonding a piezoelectric crystal formed of material selected from the group consisting of ceramic and quartz, to a solid delay line formed of material selected from the group consisting of fused silica, glass and ceramic, comprising the steps of depositing in the order named a first plurality of successive metallic layers selected from the group consisting of nickel and gold, and nickel-chrome and gold, on the broad surfaces of said crystal, depositing a layer of indium on a facet of said delay line, disposing said gold layer adjacent said indium layer, and thereafter heating the assembly so formed to a temperature ranging from about 125° C. to about 150° C. while applying a pressure of approximately 250 pounds per square inch to said assembly to bond said crystal to said delay line.

9. A cold diffusion method of bonding a piezoelectric crystal formed of material selected from the group consisting of ceramic and quartz, to a delay line formed of material selected from a group consisting of fused silica, glass, and ceramic comprising the steps of depositing on the broad surfaces of said crystal a plurality of successive metallic layers selected from the group consisting of aluminum, nickel, nickel-chrome, chrome, gold and indium, depositing on a facet of said delay line at least one metallic layer selected from the group consisting of aluminum, nickel, nickel-chrome, chrome, gold and indium, said gold and said indium forming only outer metallic layers with one of said outer metallic layers being gold and the other outer metallic layer being indium, disposing said gold layer adjacent said indium layer, and thereafter heating the assembly so formed to a temperature ranging from about 125° C. to 150° C. while applying a pressure of approximately 250 pounds per square inch to said assembly to bond said crystal to said delay line.

10. A cold diffusion method of bonding a piezoelectric crystal formed of materials selected from the group consisting of ceramic and quartz, to a delay line formed of material selected from the group consisting of fused silica, glass and ceramic, comprising the steps of depositing on the broad surfaces of said crystal a single layer of gold, depositing on the facet of said delay line at least one metallic layer selected from the group consisting of aluminum, nickel, nickel-chrome, chrome and indium, said outer metallic layer on said delay line being indium and said indium forming only the outer metallic layer, disposing said gold layer adjacent said indium layer, and thereafter heating the assembly so formed to a temperature ranging from about 125° C. to 150° C. while applying a pressure of approximately 250 pounds per square inch to said assembly to bond said crystal to said delay line.

References Cited in the file of this patent

UNITED STATES PATENTS

| | | |
|---|---|---|
| 2,139,469 | Sachse | Dec. 6, 1938 |
| 2,570,248 | Kelley | Oct. 9, 1951 |
| 2,694,168 | North et al. | Nov. 9, 1954 |
| 2,746,140 | Belser | May 22, 1956 |
| 2,754,238 | Arenberg | July 10, 1956 |
| 2,800,710 | Dunn | July 30, 1957 |
| 2,877,431 | McSkimin | Mar. 10, 1959 |
| 2,907,935 | Nagorsen | Oct. 6, 1959 |
| 2,964,839 | Marafioti et al. | Dec. 20, 1960 |
| 3,006,067 | Anderson et al. | Oct. 31, 1961 |
| 3,025,479 | Wolfskill | Mar. 13, 1962 |
| 3,032,869 | Hochman | Oct. 9, 1962 |

OTHER REFERENCES

"Electrical Contact with Thermo-Compression Bonds," Bell Laboratories Record, April 1958, pp. 127–130.

The Review of Scientific Instruments; "A Technique of Soldering To Thin Metal Films," vol. 25, No. 2, February 1954, pages 180–183.